(12) United States Patent
White et al.

(10) Patent No.: US 8,273,142 B2
(45) Date of Patent: Sep. 25, 2012

(54) SILICON POLISHING COMPOSITIONS WITH HIGH RATE AND LOW DEFECTIVITY

(75) Inventors: Michael White, Oswego, IL (US);
Richard Romine, Geneva, IL (US);
Brian Reiss, Woodridge, IL (US);
Jeffrey Gilliland, Montgomery, IL (US);
Lamon Jones, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 232 days.

(21) Appl. No.: 12/807,324

(22) Filed: Sep. 2, 2010

(65) Prior Publication Data

US 2012/0058642 A1     Mar. 8, 2012

(51) Int. Cl.
*B24D 3/02*     (2006.01)
*C09C 1/68*     (2006.01)
*C09K 3/14*     (2006.01)

(52) U.S. Cl. .............. 51/307; 51/308; 51/309; 438/689; 438/690; 438/691; 438/692; 438/693

(58) Field of Classification Search .................. None
See application file for complete search history.

(56) References Cited

U.S. PATENT DOCUMENTS

2008/0261400 A1* 10/2008 Yoshida et al. ............... 438/692
2011/0092505 A1*  4/2011 Burgis et al. ............... 514/235.5
2011/0136344 A1*  6/2011 Reiss et al. ................... 438/693

* cited by examiner

*Primary Examiner* — Duy Deo
(74) *Attorney, Agent, or Firm* — Thomas E. Omholt; Derek W. Barnett; Steven D. Weseman

(57) ABSTRACT

The invention relates to a chemical-mechanical polishing composition comprising silica, one or more organic carboxylic acids or salts thereof, one or more polysaccharides, one or more bases, optionally one or more surfactants and/or polymers, optionally one or more reducing agents, optionally one or more biocides, and water, wherein the polishing composition has an alkaline pH. The polishing composition exhibits a high removal rate and low particle defects and low haze. The invention further relates to a method of chemically-mechanically polishing a substrate using the polishing composition described herein.

59 Claims, No Drawings

SILICON POLISHING COMPOSITIONS WITH HIGH RATE AND LOW DEFECTIVITY

BACKGROUND OF THE INVENTION

Silicon wafers used in electronic devices are typically prepared from a single crystal silicon ingot that is first sliced into thin wafers using a diamond saw and then ground to remove surface imperfections arising from the sawing process. The silicon wafers thereafter typically require a final polishing step to provide surfaces having very low surface roughness before the silicon wafers are acceptable for use in electronic devices.

Current methods of performing the final polishing of silicon wafers often employ polishing compositions that contain silica as an abrasive in an aqueous carrier and further comprising additives such as amines or quaternary ammonium salts as polishing rate enhancers. Conventional polishing compositions for silicon wafers generally require over 10 minutes of polishing in order to remove 10-20 microns of silica.

Polishing compositions are desired that can be used to polish silicon more quickly to improve throughput and more effectively utilize production capacity. It is well known to use amines in silicon slurries to increase the removal rate. However, the use of amines in polishing slurries is accompanied by an increase in particle defects and haze on the substrate. Further, in view of environmental concerns such as waste water treatment regulations, the use of amine additives are undesirable.

Thus, there is a need in the art for improved chemical-mechanical polishing compositions exhibiting a high removal rate, low particle defects, and low haze.

BRIEF SUMMARY OF THE INVENTION

The invention provides a chemical-mechanical polishing composition comprising an abrasive, a rate accelerator, a polysaccharide, a base, optionally a surfactant and/or polymer, optionally a reducing agent, and water.

The invention particularly provides a chemical-mechanical polishing composition comprising (a) silica, (b) one or more organic carboxylic acids or salts thereof, (c) one or more polysaccharides selected from the group consisting of a hydroxyalkylcellulose, carrageenan, and xanthan gum, (d) one or more bases, (e) optionally one or more surfactants and/or polymers, (f) optionally one or more reducing agents, (g) optionally one or more biocides, and (h) water, wherein the polishing composition has an alkaline pH.

The chemical-mechanical polishing composition in accordance with the invention desirably exhibits a high removal rate, low particle defectivity, and low haze. Moreover, at least some embodiments of the polishing composition in accordance with the invention have a low solids content, thereby being of relatively low cost.

The invention further provides a method of chemically-mechanically polishing a substrate with the inventive chemical-mechanical polishing composition. Typically, the substrate comprises silicon.

DETAILED DESCRIPTION OF THE INVENTION

The invention provides a chemical-mechanical polishing composition and a method of chemically-mechanically polishing a substrate (e.g., silicon wafer), wherein the polishing composition comprises one or more polysaccharides and one or more rate accelerators. Applicants have found that conventional amine rate accelerators lead to increased particle defects and increased haze in polished substrates.

In an embodiment, the chemical-mechanical polishing composition comprises, consists essentially of, or consists of (a) silica, (b) one or more organic carboxylic acids or salts thereof, (c) one or more polysaccharides selected from the group consisting of a hydroxyalkylcellulose, carrageenan, and xanthan gum, (d) one or more bases, (e) optionally one or more surfactants and/or polymers, (f) optionally one or more reducing agents, (g) optionally one or more biocides, and (h) water, wherein the organic carboxylic acid is selected from the group consisting of dicarboxylic acids, amino acids, hydroxy acids, amino-carboxy substituted pyrazine compounds, and amino-carboxy substituted triazole compounds, and wherein the polishing composition has an alkaline pH.

The polishing composition of the invention desirably exhibits a high removable rate when polishing a substrate according to a method of the invention. For example, when polishing silicon wafers in accordance with an embodiment of the invention, the polishing composition desirably exhibits a removal rate of about 500 Å/min or higher, preferably about 700 Å/min or higher, and more preferably about 1000 Å/min or higher.

Moreover, the polishing composition of the invention desirably exhibits low particle defects when polishing a substrate, as determined by suitable techniques. Particle defects on a substrate polished with the inventive polishing composition can be determined by any suitable technique. For example, laser light scattering techniques, such as dark field normal beam composite (DCN) and dark field oblique beam composite (DCO), can be used to determine particle defects on polished substrates. A substrate, especially silicon, polished with the inventive polishing composition desirably has a DCN value of about 4000 counts or less, e.g., about 3500 counts or less, about 3000 counts or less, about 2500 counts or less, about 2000 counts or less, about 1500 counts or less, or about 1000 counts or less. Alternatively, or in addition, a substrate, especially silicon, polished with the inventive polishing composition desirably has a DCO value of about 2000 counts or less, e.g., about 1500 counts or less, about 1000 counts or less, or about 500 counts or less.

The polishing composition of the invention desirably exhibits a low haze when polishing a substrate, as determined by suitable techniques. For example, dark field, narrow acceptance, normal incidence beam (DNN) measurement from a laser light scattering technique can be used to measure haze on polished substrates. A substrate, especially silicon, polished with the inventive polishing composition desirably has a haze (DNN measurement) of about 0.2 ppm or less, more preferably about 0.1 ppm or less, and most preferably about 0.05 ppm or less.

The chemical-mechanical polishing composition desirably consists essentially of: (a) silica, (b) one or more organic carboxylic acids or salts thereof selected from the group consisting of (i) dicarboxylic acids of the formula:

wherein n is an integer of 0-8 and each of $R^1$ and $R^2$ is independently selected from the group consisting of hydrogen, a hydroxy group, and $C_1$-$C_6$ alkyl groups, or $R^1$ and $R^2$ together form an oxo group, and when n is 2 or more, the bonds between the $CR^1R^2$ groups are independently selected from the group consisting of single, double, or triple bonds; (ii) amino acids of the formula:

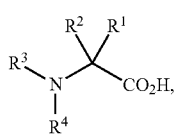

wherein each of $R^1$, $R^2$, $R^3$, and $R^4$ is independently selected from the group consisting of hydrogen, an aminoalkyl group, a carboxyalkyl group, a hydroxyalkyl group, a —$(CH_2)_n$- group, and a —$(CH=CH—)_n$ group connecting either $R^1$ or $R^2$ with either $R^3$ or $R^4$, wherein n is an integer of 1-6; (iii) aliphatic hydroxy acids of formula (1):

wherein n is an integer of 0-8 (i.e., n is 0, 1, 2, 3, 4, 5, 6, 7, or 8), and each of $R^1$-$R^3$ is independently selected from the group consisting of hydrogen, alkyl, hydroxy, and hydroxyalkyl, wherein at least one of $R^1$-$R^3$ is hydroxy or hydroxyalkyl; or aromatic hydroxy acids of formula (2):

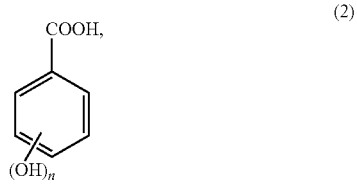

wherein n is an integer of 1-5; (iv) carboxy substituted pyrazine compounds; and (v) carboxy substituted triazole compounds, (c) one or more polysaccharides selected from the group consisting of a hydroxyalkylcellulose, carrageenan, and xanthan gum, (d) one or more bases, (e) optionally one or more surfactants and/or polymers, (f) optionally one or more reducing agents, (g) optionally one or more biocides, and (h) water, wherein the polishing composition has an alkaline pH.

As described herein, the polishing compositions are prepared as concentrates for cost effective shipping and then diluted prior to polishing. The polishing composition concentrates can be diluted from 1:1 (e.g., one part concentrated slurry to 1 part water) up to 1:50 or even 1:100 or more.

The abrasive, e.g., metal oxide particles such as silica, can be of any suitable form, such as wet-process metal oxide particles (e.g., wet-process silica particles), fumed metal oxide particles (e.g., fumed silica particles), or combinations thereof. The abrasive preferably is silica. Wet-process metal oxide (e.g., silica) particles generally are substantially spherical in shape, while fumed metal oxide (e.g., silica) particles generally are chain-like aggregates of primary particles.

The silica can be or comprise wet-process silica (e.g., condensation-polymerized or precipitated silica particles). Condensation-polymerized silica particles typically are prepared by condensing $Si(OH)_4$ to form colloidal particles, where colloidal particles are defined as having an average particle size between about 1 nm and about 1000 nm. Such silica particles can be prepared in accordance with U.S. Pat. No. 5,230,833 or can be obtained as any of various commercially available products, such as the Akzo-Nobel Bindzil 50/80 product, the Nalco DVSTS006 product, and the Fuso PL-1, PL-1H, PL-1SL, PL-2, PL-2L, PL-3, PL-3H, PL-3L, PL-5, PL-6L, PL-7, PL-7H, PL-10H, PL-SH3 and PL-20 products, as well as other similar products available from DuPont, Bayer, Applied Research, Silbond, Nissan Chemical, Clariant, and others.

The silica can be or comprise fumed silica. Fumed silica particles can be produced from volatile precursors (e.g., silicon halides) in a pyrogenic process by hydrolysis and/or oxidation of the precursors in a high temperature flame ($H_2$/air or $H_2$/$CH_4$/air) to produce the fumed silica. The solution containing the precursor can be sprayed into a high temperature flame using a droplet generator, and the metal oxide can then be collected. Typical droplet generators include bi-fluid atomizers, high-pressure spray nozzles, and ultrasonic atomizers. Suitable fumed (also known as pyrogenic) silica particles are commercially available from producers such as Cabot, Tokuyama, and Evonik Degussa.

The silica can have any suitable average particle size (i.e., average particle diameter). The silica can have an average particle size of about 4 nm or more, 10 nm or more, e.g., about 15 nm or more, about 20 nm or more, or about 25 nm or more. Alternatively, or in addition, the silica can have an average particle size of about 200 nm or less, about 150 nm or less, about 120 nm or less, e.g., about 110 nm or less, about 100 nm or less, about 90 nm or less, about 80 nm or less, about 70 nm or less, about 60 nm or less, 50 nm or less, or about 40 nm or less. Thus, the silica can have an average particle size bounded by any two of the above endpoints. For example, the silica can have an average particle size of about 4 nm to about 200 nm, about 10 nm to about 100 nm, about 20 nm to about 100 nm, about 20 nm to about 80 nm, about 20 nm to about 60 nm, or about 20 nm to about 40 nm. For a non-spherical silica particle, the size of the particle is the diameter of the smallest sphere that encompasses the particle. The particle size of the silica can be measured using any suitable technique, for example, using laser diffraction techniques. Suitable particle size measurement instruments are available from e.g., Malvern Instruments (Malvern, UK).

The polishing composition can comprise any suitable amount of silica. The concentrated polishing composition can comprise about 20 wt. % or less of silica, e.g., about 15 wt. % or less, about 10 wt. % or less, about 8 wt. % or less, about 9 wt. % or less, about 8 wt. % or less, about 7 wt. % or less, about 6 wt. % or less, about 5 wt. % or less, about 4 wt. % or less, about 3 wt. % or less, or about 2 wt. % or less of silica. After dilution, the polishing composition can comprise about 0.001 wt. % or more of silica, e.g., about 0.01 wt. % or more, about 0.1 wt. % or more, about 0.5 wt. % or more, or about 1 wt. % or more of silica. Thus, the polishing composition can comprise silica in an amount bounded by any two of the above endpoints recited for silica. For example, the polishing composition can comprise about 0.001 wt. % to about 20 wt. % of silica, or about 0.001 wt. % to about 15 wt. %, about 0.001 wt. % to about 10 wt. %, about 0.001 wt. % to about 8 wt. %, about 0.001 wt. % to about 6 wt. %, about 0.001 wt. % to about 5 wt. % of silica, about 0.001 wt. % to about 2 wt. %, or about 0.05 wt. % to about 2 wt. % of silica. In a preferred embodiment, the polishing composition comprises, at point of use, between about 0.2 wt. % and about 0.6 wt. % of silica.

The silica particles preferably are colloidally stable in the inventive polishing composition. The term colloid refers to the suspension of silica particles in the liquid carrier. Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≦0.5). More preferably, the value of [B]−[T]/[C] is less than or equal to 0.3, and most preferably is less than or equal to 0.1.

The inventive polishing composition comprises a rate enhancer in combination with a polysaccharide. Surprisingly, a rate enhancer in combination with a polysaccharide and, optionally, a polymer or surfactant can provide a chemical-mechanical polishing composition that exhibits a high rate removal, low particle defects, and low haze.

The rate enhancer desirably is one or more organic carboxylic acids. In an embodiment, the polishing composition comprises one or more organic carboxylic acids, salts thereof, and/or hydrates thereof, selected from the group consisting of (i) dicarboxylic acids, (ii) amino acids, (iii) hydroxy acids, (iv) carboxy substituted pyrazine compounds, and (v) carboxy substituted triazole compounds. Not wishing to be bound by any particular theory, it is believed that the carboxylic acid activates the polishing particle (e.g. silica) or substrate (e.g., silicon) by forming hypercoordinate compounds (e.g., pentacoordinate or hexacoordinate silicon compounds).

The polishing composition can comprise any suitable amount of one or more organic carboxylic acids. The polishing composition can comprise about 0.0005 wt. % or more of the organic carboxylic acid(s), e.g., about 0.005 wt. % or more, about 0.05 wt. % or more, about 0.5 wt. % or more of the organic carboxylic acid(s). Alternatively, or in addition, the polishing composition can comprise about 2 wt. % or less of the organic carboxylic acid(s), e.g., about 1.5 wt. % or less, about 1.0 wt. % or less, or about 0.5 wt. % or less of the organic carboxylic acid(s). Thus, the polishing composition can comprise one or more organic carboxylic acid(s) in a total amount bounded by any two of the aforementioned endpoints recited for the organic carboxylic acid(s). For example, the polishing composition can comprise about 0.0005 wt. % to about 2 wt. %, about 0.005 wt. % to about 2 wt. %, about 0.005 wt. % to about 1 wt. %, about 0.005 wt. % to about 0.05 wt. %, of the organic carboxylic acid(s). In a preferred embodiment, the polishing composition comprises less than about 1 wt. % of the organic carboxylic acid(s).

Suitable organic carboxylic acids include dicarboxylic acids of the formula:

wherein n is an integer of 0-8 (i.e., n is 0, 1, 2, 3, 4, 5, 6, 7, or 8). In an embodiment where n is 2 or more (i.e., 2, 3, 4, 5, 6, 7, or 8), the bond(s) between the $CR^1R^2$ groups are independently selected from the group consisting of single, double, or triple bonds. In preferred embodiments, n is 0, 1, or 2, more preferably n is 1 or 2.

In embodiments where n is 2 or more and the bonds between the $CR^1R^2$ groups are double bonds, the configuration of the double bonds is (E), (Z), or a mixture thereof, including a racemic mixture. Maleic acid is an illustrative dicarboxylic acid wherein n is 2, and the bond between $CR^1R^2$ units is a double bond having the (Z)-configuration.

Typically, each of $R^1$ and $R^2$ of the dicarboxylic acid is independently selected from the group consisting of hydrogen, hydroxy, and $C_1$-$C_6$ alkyls (i.e., methyl, ethyl, propyl, isopropyl, butyl, isobutyl, sec-butyl, pentyl, isopentyl, sec-pentyl, neo-pentyl, hexyl, isohexyl, sec-hexyl, and neo-hexyl), or $R^1$ and $R^2$ together form an oxo group. In a preferred embodiment, each of $R^1$ and $R^2$ of the dicarboxylic acid is independently selected from the group consisting of hydrogen, hydroxy, and $C_1$-$C_4$ alkyl, or $R^1$ and $R^2$ together form an oxo group. In a particularly preferred embodiment, each of $R^1$ and $R^2$ of the dicarboxylic acid is independently selected from the group consisting of hydrogen and hydroxy.

Non-limiting examples of suitable dicarboxylic acids include malonic acid, methyl malonic acid, dimethyl malonic acid, butyl malonic acid, maleic acid, sodium mesooxalate monohydrate, tartaric acid, malic acid, oxalic acid, and mixtures thereof.

In a particularly preferred embodiment, the dicarboxylic acid is malonic acid or tartaric acid.

Suitable organic carboxylic acids include amino acids of the formula:

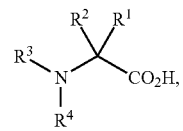

wherein each of $R^1$, $R^2$, $R^3$, and $R^4$ is independently selected from the group consisting of hydrogen, an aminoalkyl group, a carboxyalkyl group, a hydroxyalkyl group, a —$(CH_2)_n$—, and —$(CH=CH—)_n$ group connecting either $R^1$ or $R^2$ with either $R^3$ or $R^4$, wherein n is an integer from 1-6.

An illustrative amino acid is glycine, wherein each of $R^1$-$R^4$ is hydrogen.

The aminoalkyl group desirably is an amino $C_1$-$C_6$ alkyl group (e.g., aminomethyl, aminoethyl, aminopropyl, aminobutyl, aminopentyl, or aminohexyl). An illustrative amino acid comprising an aminoalkyl substituent is lysine, wherein one of $R^1$ or $R^2$ is an aminobutyl group and the remaining $R^1$-$R^4$ substitutents are hydrogen.

The carboxyalkyl group desirably is a carboxy $C_1$-$C_6$ alkyl group (e.g., carboxymethyl, carboxyethyl, carboxypropyl, carboxybutyl, carboxypentyl, or carboxyhexyl). Illustrative amino acids comprising a carboxyalkyl substitutent include, for example, aspartic acid and glutamic acid, wherein one of $R^1$ or $R^2$ is either carboxymethyl (aspartic acid), or carboxyethyl (glutamic acid), and the remaining $R^1$-$R^4$ substituents are hydrogen. Another illustrative amino acid comprising one or more carboxyalkyl substitutents is nitrilotriacetic acid, wherein each of $R^1$ and $R^2$ are hydrogen and each of $R^3$ and $R^4$ are carboxymethyl.

The hydroxyalkyl group desirably is a hydroxy $C_1$-$C_6$ alkyl group (e.g., hydroxymethyl, hydroxyethyl, hydroxypropyl, hydroxybutyl, hydroxypentyl, or hydroxyhexyl). An illustrative amino acid comprising a hydroxyalkyl substitutent is serine, wherein one of $R^1$ or $R^2$ is hydroxymethyl, and the remaining $R^1$-$R^4$ substituents are hydrogen. Another illustrative amino acid comprising one or more hydroxyalkyl substitutents is bicine, wherein each of $R^1$ and $R^2$ are hydrogen and each of $R^3$ and $R^4$ are hydroxyethyl.

The amino acid can be a cyclic amino acid wherein one of $R^1/R^2$ and one of $R^3/R^4$ are connected via a —$(CH_2)_n$— group, wherein n is an integer of 1-6 (i.e., n is 1, 2, 3, 4, 5, or 6), thereby forming an aliphatic heterocyclic compound. In a preferred embodiment, n is 4. Pipecolic acids, picolinic acids and proline are an illustrative amino acid wherein one of $R^1/R^2$ and one of $R^3/R^4$ are connected via a —$(CH_2)_4$— group or a —$(CH=CH—)_n$ group.

In accordance with the invention, amino acids can have any suitable stereochemistry as appropriate (e.g., D-, L-, R-, S-, and mixtures thereof, including racemic mixtures).

Suitable organic carboxylic acids include aliphatic hydroxy acids of the formula (1):

$$(R^3R^2R^1C)_n\!\!-\!\!CO_2H, \qquad (1)$$

wherein n is an integer of 0-8 (i.e., n is 0, 1, 2, 3, 4, 5, 6, 7, or 8), and each of $R^1$-$R^3$ is independently selected from the group consisting of hydrogen, alkyl, hydroxy, and hydroxyalkyl, wherein at least one of $R^1$-$R^3$ is hydroxy or hydroxyalkyl. In a preferred embodiment, n of the aliphatic hydroxy acid of formula (1) is an integer from 1-3.

The alkyl group of the aliphatic hydroxy acid of formula (1) is typically a $C_1$-$C_6$ alkyl group (e.g., methyl, ethyl, propyl, butyl, pentyl, or hexyl). Typically, the hydroxyalkyl group of the hydroxy acid of formula (1) is a hydroxy $C_1$-$C_6$ alkyl (e.g., hydroxymethyl). In a preferred embodiment the hydroxy acid of formula (1) is an aliphatic hydroxy acid. Illustrative aliphatic hydroxy acids of formula (1) include, for example, lactic acid, glycolic acid, 2-hydroxybutyric acid, and dimethylolpropionic acid.

Suitable carboxylic acids also include aromatic hydroxy acids of the formula (2):

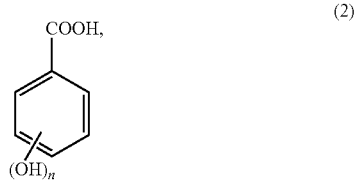

(2)

wherein n is an integer of 1-5. The aromatic hydroxy acid can have any suitable substitution pattern (e.g., ortho-, meta-, para-substituted, and/or mono-, di-, tri-, tetra-, and penta-substituted). Non-limiting examples of suitable aromatic hydroxy acids include 3,4,5-trihydroxybenzoic acid (i.e., gallic acid), 4-hydroxybenzoic acid, 2-hydroxybenzoic acid (i.e., salicylic acid), 2,4-dihydroxybenzoic acid, 2,3-dihydroxybenzoic acid, and 3,4-dihydrobenzoic acid.

Suitable organic carboxylic acids include carboxy substituted pyrazine compounds. Illustrative suitable carboxy substituted pyrazine compounds include, for example, 3-aminopyrazine-2-carboxylic acid, 5-methyl-2-pyrazine carboxylic acid, and pyrazine-2-carboxylic acid. Illustrative substituents of the carboxy substituted pyrazine include linear and branched $C_1$-$C_6$ alkyl groups (e.g., methyl, ethyl, propyl, iso-propyl, butyl, iso-butyl, sec-butyl, tert-butyl, pentyl, isopentyl, sec-pentyl, tert-pentyl, neo-pentyl, hexyl, iso-hexyl, sec-hexyl, tert-hexyl, and neo-hexyl) and linear and branched $C_1$-$C_6$ alkoxy groups, and $C_6$-$C_{10}$ aryl groups (e.g., phenyl, benzyl, naphthyl). The $C_6$-$C_{10}$ aryl groups may be substituted or unsubstituted.

Suitable organic carboxylic acids include carboxy substituted triazole compounds. Illustrative carboxy substituted triazole compounds suitable for the present invention include, for example, 3-amino-1,2,4-triazole-5-carboxylic acid. Illustrative substituents of the carboxy substituted triazole compounds include linear and branched $C_1$-$C_6$ alkyl groups (e.g., methyl, ethyl, propyl, iso-propyl, butyl, iso-butyl, sec-butyl, tert-butyl, pentyl, isopentyl, sec-pentyl, tert-pentyl, neo-pentyl, hexyl, iso-hexyl, sec-hexyl, tert-hexyl, and neo-hexyl) and linear and branched $C_1$-$C_6$ alkoxy groups, and $C_6$-$C_{10}$ aryl groups (e.g., phenyl, benzyl, naphthyl). The $C_6$-$C_{10}$ aryl groups may be substituted or unsubstituted.

The polishing composition comprises one or more polysaccharides (e.g., modified cellulose ether, or complex carbohydrates) as a rheology modifier. The one or more polysaccharides can be one or more modified cellulose ethers or one or more complex carbohydrates (e.g., gums such as xanthan gum, guar gum, karaya gum, carrageenan gum, or pectin, and sodium hyaluronate). Not wishing to be bound by any particular theory, it is believed that the polysaccharide enhances the chemical-mechanical polishing performance of the polishing composition by adsorbing to the surface of the silicon wafer thereby increasing the polishing activation barrier between the particle and silicon substrate thereby improving roughness by polishing the raised areas ("hills") faster than the lower areas ("valleys") thus reducing roughness, providing a protective barrier between the particle and substrate that facilitates particle cleaning, modifying the viscoelastic properties of the polishing system, for example, by acting as a thickening agent in the composition, improving the wettability of a polishing substrate, and/or stabilizing the silica dispersion of the polishing composition.

In an embodiment, the one or more polysaccharides are selected from the group consisting of hydroxyalkylcelluloses, carrageenan, and xanthan gum. In a preferred embodiment, the polysaccharide is a modified cellulose ether (e.g., a hydroxyalkylcellulose). Illustrative hydroxyalkylcellulose ethers include methylhydroxyethyl cellulose (HEMC), methylhydroxypropyl cellulose (HPMC), hydroxyethyl cellulose (HEC), methyl cellulose (MC) and hydroxypropyl cellulose (HPC).

In a particularly preferred embodiment, the hydroxyalkylcellulose is hydroxyethyl cellulose.

The polishing composition can comprise any suitable amount of the one or more polysaccharides. The polishing composition can comprise about 0.0001 wt. % or more of the polysaccharide(s), e.g., about 0.001 wt. % or more, about 0.01 wt. % or more of the polysaccharide(s), or about 0.05 wt % or more of the polysaccharide(s). Alternatively, or in addition, the polishing composition can comprise about 0.5 wt. % or less of the polysaccharide(s), e.g., about 0.1 wt. % or less of the polysaccharide(s), about 0.05 wt. % or less, about 0.03 wt. % or less, or about 0.02 wt. % or less of the polysaccharide(s). Thus, the polishing composition can comprise one or more polysaccharides in a total amount bounded by any two of the aforementioned endpoints recited for the polysaccharide(s). For example, the polishing composition can comprise about 0.0001 wt. % to about 0.5 wt. %, about 0.001 wt. % to about 0.1 wt. %, about 0.001 wt. % to about 0.05 wt. %, about 0.001 wt. % to about 0.003 wt. %, or about 0.001 wt. % to about 0.002 wt. % of the polysaccharide(s). In a preferred embodiment, the polishing composition comprises, at polish, about 0.06 wt. % of a polysaccharide (e.g., 570-630 ppm). In another preferred embodiment, the polishing composition comprises about 0.0030 wt. % of a polysaccharide (e.g., 28-32 ppm), at point of use.

The polysaccharide can be of any suitable molecular weight. For example, when the polysaccharide is a modified cellulose ether (e.g., HEC, HEMC, HPMC, and HPC), the average molecular weight can be about 300,000 g/mol or less, e.g., about 250,000 g/mol or less, about 200,000 g/mol or less, about 150,000 g/mol or less, about 100,000 g/mol or less, or about 100,000 g/mol or less. Alternatively, or in addition, the average molecule weight can be about 10,000 g/mol or more, e.g., about 20,000 g/mol or more, about 30,000 g/mol or more, about 50,000 g/mol or more, about 75,000 g/mol or more, or about 100,000 g/mol or more. Thus, the molecular weight of the hydroxyethylcellulose can be between any two of the aforementioned endpoints recited for hydroxyethylcellulose. For example, the molecular weight of the hydroxyethylcellulose can be about 10,000 g/mol to about 300,000 g/mol, about 20,000 g/mol to about 200,000 g/mol, about 50,000 g/mol to about 150,000 g/mol, about 50,000 g/mol to about 100,000 g/mol, or about 75,000 g/mol to about 100,000 g/mol. In a preferred embodiment, the average molecular weight of the hydroxyethylcellulose is about 80,000 g/mol (e.g., 83,000 g/mol).

When the polysaccharide is xanthan gum the average molecular weight is typically about 300,000 g/mol.

In keeping with the invention, the average molecular weight of carrageenan is such that the polishing composition is enhanced as described herein.

The polishing composition comprises at least one base. The base(s) can be any suitable base(s). In some embodiments, the polishing composition contains at least one base that is an inorganic base, for example, an alkali metal salt (e.g., potassium salt). Typically, the one or more bases are selected from the group consisting of alkali metal hydroxides, alkali metal carbonates, alkali metal bicarbonates, and borates. As known in the art, suitable alkali metals include, for example, lithium, sodium, potassium, rubidium, cesium, and francium.

In a preferred embodiment, the one or more bases are selected from the group consisting of potassium hydroxide, potassium carbonate, and potassium bicarbonate.

In a preferred embodiment, examples of suitable borates include boric acid, potassium borate and dipotassium borate.

The polishing composition can comprise any suitable amount of the base(s), such that the pH of the polishing composition is alkaline. In particular, the pH of the polishing compositions is greater than 7. In a preferred embodiment, the pH of the polishing composition is about 8-12 (e.g., 8-10, 8-11, 9-10, 9-11, or 9-12), more preferably the pH is about 9-11 (e.g., about 9-10 or about 9.5).

The polishing composition optionally comprises one or more surfactants. A typical disadvantage to the presence of surfactants is often a reduction of the overall removal rate for the silicon surface. The absorption of surfactants onto the silicon surface acts to reduce the contact of the abrasive particles with the silicon at the surface, and since contact of the abrasive particles with the metal surface is the primary mechanism by which the silicon surface is abraded, the removal rate is reduced, often below useful rates, thereby limiting the usefulness of surfactants in polishing compositions. However, the presence of one or more surfactants in the inventive polishing composition advantageously improves the haze or DCO defectivity.

The one or more surfactants can be present in the polishing composition in any suitable amount. If the amount of surfactant(s) is too low, then no advantage is observed with the addition of the surfactant. If the amount of surfactant(s) is too high, then a reduction in the removal rate is observed. The amount of the surfactant(s) can be about 0.1 ppm or more, about 0.5 ppm or more, about 1 ppm or more, about 5 ppm or more, about 10 ppm or more, about 20 ppm or more, about 50 ppm or more, about 100 ppm or more, or about 200 ppm or more. Alternatively, or in addition, the amount of the surfactant(s) can be about 1000 ppm or less, about 800 ppm or less, about 600 ppm or less, about 400 ppm or less, or about 200 ppm or less. Thus, the polishing composition can comprise one or more surfactants in a total amount bounded by any two of the aforementioned endpoints recited for the surfactant(s).

For example, the polishing composition can comprise about 10 ppm to about 1000 ppm, about 20 ppm to about 800 ppm, about 50 ppm to about 400 ppm, or about 100 ppm to about 200 ppm of the surfactant(s). In a preferred embodiment, the amount of the surfactant(s) in the polishing composition is about 5 ppm. In another preferred embodiment, the amount of the surfactant(s) in the polishing composition is about 150 ppm. In addition, surfactants can be incorporated with any useful co-solvent.

The surfactant(s), when present, can be any suitable surfactant(s). Typically, the surfactant(s) will be selected from the group consisting of nonionic surfactants and anionic surfactants. In a preferred embodiment, the surfactant is a nonionic surfactant. Illustrative nonionic surfactants include acetylenic diol surfactants and hydrophobated polyethylene glycol surfactants.

Illustrative acetylenic diol surfactants are the SURFYNOL™ products that are commercially available from Air Products. An example of a SURFYNOL™ surfactant is SURFYNOL™ 104 (i.e., 1,4-diisobutyl-1,4-dimethylbutynediol), which is a nonionic wetting agent and molecular defoamer available as a waxy solid, a liquid, or a free-flowing powder.

Illustrative hydrophobated polyethelene glycol surfactants are the IGEPAL™ ethoxylated, nonylphenol polyethers available commercially from Stepan Company. An example of an IGEPAL™ surfactant is IGEPAL™ CO-730, also referred to as nonoxynol-15 and BRIJ™ 93 an ethoxylated cetyl alcohol.

Other illustrative nonionic surfactants include copolymer surfactants comprising siloxane units, ethylene oxide units, and propylene oxide units. The structure of the aforementioned copolymer surfactants can be linear, pendant, or trisiloxane type. Preferred examples of such copolymer surfactants are commercially available as the SILWET™ family of surfactants, with a pendant structure, available commercially from Momentive Performance Materials. The copolymer surfactant comprising siloxane units, ethylene oxide units, and propylene oxide units can have any suitable molecular weight or structure.

Suitable nonionic surfactants also include polymers comprising acrylic esters. Preferred polymers comprising acrylic esters comprise acrylic ester monomers substituted on the alcohol component of the ester monomers with fluorine, e.g., wherein at least one hydrogen atom of the alcohol component is substituted with fluorine. Preferred examples of such polymers comprising acrylic esters are commercially available from 3M as FLUORAD™ surfactants.

Suitable nonionic surfactants further include linear polymers of ethylene oxide comprising a perfluorinated alkyl chain at one terminus and a hydroxyl group or alkyl group at the other terminus. Preferred examples of such polymers include the ZONYL™ line of surfactants that are commercially available from DuPont.

Suitable nonionic surfactants additionally include copolymers of ethylenediamine with ethylene oxide units and propylene oxide units. Preferred examples of such copolymers include the TETRONIC™ family of block copolymer surfactants that are commercially available from BASF.

In another preferred embodiment, the surfactant is an anionic surfactant, especially at least one selected from a sulfonic acid, sulfate ester, carboxylic acid surfactant, phosphate and phosphonate or phosphoric acid ester surfactant. Sulfonate salts having the general formula $H-[CH_2]_nSO_4^-$ are preferred, wherein n typically is an integer of from 1 to 18. An example of such an anionic surfactant is sodium dodecyl sulfate (SDS). Some examples of a phosphate surfactants are Zonyl FSE (fluorinated) and Huntsman PP1198.

The polishing composition optionally comprises one or more polymers. The polymers can be any suitable polymers. One or more polymers (e.g., a urethane polymer or acrylate polymer) typically are included in the polishing composition to adsorb to the wafer surface or to improve the rheological properties of the polishing composition. Illustrative polymers include polyethylene glycol polyurethanes or water-soluble acrylates.

Suitable polyethylene glycol polyurethane polymers include, for example, the BORCHI™ Gel products commercially available from OMG Borchers GmbH. Illustrative BORCHI™ Gels include BORCHI™ Gel 0024, BORCHI™ Gel 0434, BORCHI™ Gel WN 50S, BORCHI™ Gel L75N, and BORCHI™ Gel PW25, all of which act as associative thickeners. The BORCHI™ Gels are polyethylene glycol polyurethane polymers based on the general structure:

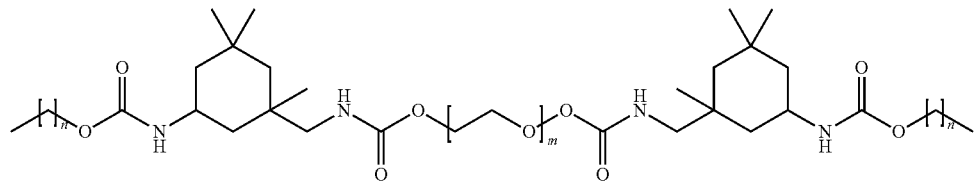

wherein the degree of ethyoxylation and alkylation, represented by m and n, respectively, varies. Alternately, the polyurethane structure can be based on any suitable multifunctional isocyanate such as, for example, toluene diisocyanate (TDI), 4,4-methylenebisphenyldiisocyanate (MDI), hexamethylene diisocyante (HDI), HDI-trimer, and polymeric-MDI. Not wishing to be bound by a particular theory, it is believed that polyethylene glycol polyurethane polymers, especially the BORCHI™ Gels, adsorbing to the surface of the silicon wafer thereby increasing the polishing activation barrier between the particle and silicon substrate thereby improving roughness by polishing the raised areas ("hills") faster than the lower areas ("valleys") thus reducing roughness, providing a protective barrier between the particle and substrate that facilitates particle cleaning, or form a non-covalent network within the polishing composition, thereby stabilizing viscosity, in particular under high shear conditions.

The polyethylene glycol polyurethane polymers can have any suitable molecular weight. The molecular weights of BORCHI™ Gel 0434, BORCHI™ Gel WN 50S, and BORCHI™ Gel PW25, as determined by gel permeation chromatography, range from about 10,000 g/mol to about 40,000 g/mol depending on the degree of ethoxylation and alkylation.

BORCHI™ Gel 0024 is a liquid, glycol ether-free, non-ionic polyurethane based thickener that is used to produce Newtonian flow in the medium and high shear range. BORCHI™ Gel 0024 can be used in combination with other low-shear thickeners (e.g., BORCHI™ Gel PW25 or BORCHI™ Gel LW44) to modify the rhelogical profile of a composition. BORCHI™ Gel 0024 has a density of 1.04-1.08 g/cm$^3$ and viscosity of 2,000-10,000 mPa·s, as measured at 23° C.

BORCHI™ Gel 0434 is a liquid, glycol ether-free, non-ionic polyurethane-based associative thickener that is free of solvents, alkylphenol ethoxylate (APEO), HAPS (Hazardous Air Pollutants), and tin compounds, and has a largely Newtonian rheological profile. BORCHI™ Gel 0434 forms a non-covalent network within a composition to stabilize viscosity, in particular at higher shear. BORCHI™ Gel 0434 has a density of 1.01-1.05 g/cm$^3$ and a maximum viscosity of 15,000 mPa·s, as measured at 23° C.

BORCHI™ Gel L75N is a liquid, glycol ether-free, non-ionic polyurethane-based thickener manufactured using aliphatic isocyanates. BORCHI™ Gel L75N functions as a flow promoter in emulsions and as a stabilizer in aqueous systems, and improves the rheological profile of emulsion by adsorbing at the surface of dispersed particles. BORCHI™ Gel L75N has a viscosity less than 9,000 mPa·s, as measured at 23° C.

Other examples of suitable polymers are the DSX™ associative thickener products available from Cognis. The DSX™ thickeners, based on polyether and polyurethane derivatives, are pH-independent and are free of solvents, alkylphenyl ethoxylates (APEOs), and heavy metals. Not wishing to be bound by theory, it is believed that the hydrophobic terminal and side groups of the DSX™ thickeners combine to form networks that serve to increase viscosity of the polishing composition. An illustrative DSX™ thickener is DSX™ 3000 having a density at 25° C. of 1.05 g/cm$^3$, a viscosity of 4000-6000 mPa·s, and a solids content of 30%.

In some embodiments, the polishing composition comprises one or more water-soluble acrylate polymers. A suitable example of a water soluble acrylate is BORCHI™ Gel A LA available from OMG Borchers GmbH. BORCHI™ Gel A LA has the following properties: liquid with a viscosity at 20° C. of 25,000-60,000 mPa·s; non-volatile content 9-11%; pH≧8; and a density at 20° C. of approximately 1.05 g/cm$^3$. Other suitable water-soluble acrylate polymers are the ALCOGUM™ L Series products commercially available from AkzoNobel. The ALCOGUM™ L Series products are acrylate-based emulsion copolymers that serve as rheology modifiers to facilitate a reproducible viscosity in the polishing composition. Suitable examples of ALCOGUM™ L Series products include ALCOGUM™ L15, L31, and L283.

ALCOGUM™ L-15 is an acrylate-based emulsion copolymer supplied at 30% active solids in water having the following properties: pH of 2.2-3.0; solids of 29-31%; viscosity of 10,000-15,000 (pH 9.0, NaOH, 25° C., 10 rpm), 2.5% (dry).

ALCOGUM™ L-31 is based on an ethyl acrylate-methacrylic acid copolymer. ALCOGUM™ L-283 is an acrylate-based emulsion copolymer supplied at 25% active solids in water, and is a hydrophobically modified, alkali-soluble emulsion polymer (e.g., a HASE thickener). ALCOGUM™ L-283 has the following properties: pH 4.5-5.5; solids 24-26%; viscosity 30,000-52,000 cPs, 2.0% (dry), (pH 9.0, NH$_4$OH, 25° C., 10 rpm); density at 25° C. of 1.05 kg/L.

In some embodiments, the polishing composition comprises one or more polymers that act as a thixotropic agent. An illustrative thixotropic agent is BORCHI™ Gel Thixo 2, which is a thixotropic agent and thickener of non-polar/weakly polar nature.

The polishing composition optionally comprises one or more reducing agents. The reducing agent(s) can be any suitable reducing agent. One or more reducing agents can be included in the polishing composition to increase removal rate and improve defectivity when using soft polishing pads and low removal polishing pads (e.g., CIEGAL™ 7355). Illustrative suitable reducing agents include sulfite salts, for example, potassium metabisulfite.

The one or more reducing agents can be present in the polishing composition in any suitable amount. If the amount of reducing agent(s) is too low, then no advantage is observed with the addition of the reducing agent. If the amount of reducing agent(s) is too high, then an increase in substrate haze or a loss of colloidal stability can be observed. The polishing composition can comprise about 0.0001 wt. % or more of the reducing agent(s), e.g., about 0.001 wt. % or more, about 0.01 wt. % or more, about 0.1 wt. % or more of the reducing agent(s). Alternatively, or in addition, the polishing composition can comprise 0.5 wt. % or less of the reducing agent(s), e.g., about 0.4 wt. % or less, about 0.3 wt. % or less, about 0.2 wt. % or less, or about 0.1 wt. % or less of the reducing agent(s). For example, the polishing composition can comprise about 0.001 wt. % to about 0.5 wt. %, about 0.01 wt. % to about 0.4 wt. %, about 0.1 wt. % to about 0.3 wt. % of the reducing agent(s). In a preferred embodiment, the polishing composition comprises, at polish, about 0.07 wt. % to about 0.15 wt. % of a reducing agent, especially about 0.1 wt. % of a reducing agent (e.g., 975-1025 ppm). In another preferred embodiment, the polishing composition comprises, at polish, about 0.02 wt. % to about 0.05 wt. % of a reducing agent, especially about 0.04 wt. %, of a reducing agent (e.g., 375-425 ppm).

The polishing composition optionally comprises one or more biocides. The biocide(s) can be any suitable biocide, for example, Dowasil 75, or 1-(3-chloroallyl)-3,5,7-triaza-1-azoniaadamantane chloride. The amount of biocide in the polishing composition typically is about 1 to about 500 ppm, preferably about 10 to about 20 ppm, at point of use.

The polishing composition comprises water. The water is used to facilitate the application of the other components of the polishing composition to the surface of a suitable substrate to be polished or planarized. Preferably, the water is deionized water. The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., silica, organic carboxylic acid, polysaccharide, optional surfactant and/or polymer, water, etc.) as well as any combination of two or more of the ingredients (e.g., silica, organic carboxylic acid, polysaccharide, optional surfactant and/or polymer, water, etc.).

It will be understood that any of the components of the polishing composition that are acids, bases, or salts (e.g., organic carboxylic acid, base, and/or alkali metal carbonate, etc.), when dissolved in the water of the polishing composition, can exist in dissociated form as cations and anions. The amounts of such compounds present in the polishing composition as recited herein will be understood to refer to the weight of the undissociated compound used in the preparation of the polishing composition. For example, the weight of an alkali metal carbonate (e.g., potassium carbonate), when present, refers to the amount of the salt, including both potassium and carbonate, as provided by its empirical formula (e.g., $K_2CO_3$).

For example, the organic carboxylic acid(s), the polysaccharide(s), the base(s), and optionally the surfactant(s) and/or polymer(s) can be dissolved in water by the addition of the organic carboxylic acid(s), the polysaccharide(s), the base(s), and optionally the surfactant(s) and/or polymer(s) to water in any order, or even simultaneously. The silica then can be added and dispersed by any method that is capable of dispersing the silica in the polishing composition. The polishing composition can be prepared prior to use, with one or more components, such as the base, added to the polishing composition shortly before use (e.g., within about 1 minute before use, or within about 1 hour before use, or within about 7 days before use). The pH can be adjusted at any suitable time, and is preferably adjusted prior to the addition of the silica to the polishing composition. The polishing composition also can be prepared by mixing the components at the surface of the substrate during the polishing operation.

The polishing composition can be in the form of a concentrate which is intended to be diluted with an appropriate amount of water prior to use. For example, the silica, the organic carboxylic acid(s), the polysaccharide(s), the base(s), optionally the surfactant(s) and/or polymer(s), and any other suitable additives can each be present in the concentrate in an amount that is about 2 times (e.g., about 5 times, about 10 times, or about 15 times, or about 20 times, or about 100 times, or even about 200 times) greater than the concentration recited above for each component so that, when the concentrate is diluted with an equal volume of water (e.g., 2 equal volumes water, 5 equal volumes of water, or 10 equal volumes of water, or 15 equal volumes of water, or 20 equal volumes of water, or 100 equal volumes of water, or 200 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the organic carboxylic acid(s), the polysaccharide(s), the base(s), optionally the surfactant(s) and/or polymer(s), and other suitable additives are at least partially or fully dissolved in the concentrate, preferably fully dissolved in the concentrate. Unless otherwise specified, the samples are made as concentrates with the concentrations specified and then are diluted with 19 parts of water per part of slurry by weight, The invention provides a method of chemical-mechanical polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

Although the polishing composition of the invention can be used to polish any substrate, the polishing composition is particularly useful in the polishing of a substrate comprising silicon, for example, silicon wafers used in the electronics industry. In this regard, the silicon can be undoped silicon, or it can be p-type silicon doped with boron or aluminum. In addition, the silicon can be polysilicon. The inventive polishing composition and method of use thereof are suitable for the final polishing of silicon wafers as produced from silicon single crystals by diamond sawing and rough grinding, as well as for edge polishing of silicon wafers and for use in the reclamation of silicon wafers by polishing.

Advantageously, silicon substrates polished using the inventive polishing method exhibit low surface roughness. Surface roughness ($R_a$), which is defined herein as the arithmetical mean of deviations from planarity, can be measured using any suitable technique. Suitable techniques include stylus profilometry and optical profilometry, using instruments available from, e.g., Veeco Instruments (Plainview, N.Y.), as well as atomic force microscopy. Typically, the inventive polishing method produces a surface roughness on silicon wafers of about 20 Å or less (e.g., about 14 Å or less, or about 12 Å or less, or about 10 Å or less, or even about 8 Å or less), when measured using an optical profilometer.

The DCN, DCO, and DNN haze measurements were done on a KLA_Tencore SP1 at a 120 nm threshold.

The polishing method of the invention is particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™ or Fujibo POLYPAS™ 27.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing endpoint, i.e., the determination of when to terminate the polishing process with respect to a particular substrate.

EXAMPLES

These examples further illustrate the invention but, of course, should not be construed as in any way limiting its scope.

Unless otherwise specified, the polishing conditions in Examples 1-18 were as follows: a Planar 472 polisher with 20.3 cm p-doped silicon wafers at 37.9 kPa down force, 74 rpm table speed, and 150-200 mL/min polishing composition flow rate. The pH of the polishing composition was adjusted with potassium hydroxide. All polishing compositions were prepared as concentrates. The concentrates were diluted for polishing using a weight ratio of 1 part concentrate to 29 parts water.

The following abbreviations are used throughout the Examples: removal rate (RR); molecular weight (Mw); hydroxyethyl cellulose (HEC); methyl hydroxyethyl cellulose (MeHEC); malonic acid (MA); tartaric acid (TA); gallic acid (GA); xanthan gum (XG); carrageenan (C); lactic acid (LA); pipecolic acid (PA); glycine (Gly); aspartic acid (Asp); 3-amino-1,2,4-triazole-5-carboxylic acid (ATCA); sodium dodecyl sulfate (SDS); aminoethylpiperazine (AEP); dimethylolpropionic acid (DMPA); piperazine (P); BORCHI™ Gel (BG); and COGNIS DSX™ 3000 (DSX 3000).

Example 1

This example demonstrates that polishing compositions of the invention, which comprise silica, an organic carboxylic acid, a polysaccharide, a base, optionally a surfactant, and water, can exhibit good overall substrate polishing properties.

Silicon substrates were polished using a SURFIN™ 000 pad commercially available from Fujimi Corporation under the same conditions with 6 different polishing compositions identified as Polishing Compositions 1A-1F. Each of Polishing Compositions 1A-1F contained (a) 0.2 wt. % Fuso PL2 silica particles, at point of use, (b) the organic carboxylic acid TA or MA in the concentration set forth in Table 1, (c) the polysaccharide HEC (MW=80,000 g/mol) or XG in the concentration set forth in Table 1, (d) sufficient potassium hydroxide to provide each polishing composition with a pH as set forth in Table 1, and (e) water. In addition, Polishing Composition 1F contained a surfactant, namely SURFYNOL™ 104.

Similar silicon substrates were polished under the same conditions with 2 other, comparative polishing compositions identified Polishing Compositions C1 and C2. Both Polishing Compositions C1 and C2 contained 6 wt. % Fuso PL2 silica particles in water (0.2 wt % at point of use), with sufficient potassium hydroxide to provide each polishing composition with a pH as set forth in Table 1. Polishing Composition C1 did not contain either an organic carboxylic acid or a polysaccharide. Polishing Composition C2 additionally contained HEC (MW=80,000 g/mol), but did not contain an organic carboxylic acid.

The substrate removal rate (RR), defectivity (both DCN and DCO), and haze (DNN) were determined for each polishing composition, and the results are summarized in Table 1.

TABLE 1

| Comp. | Carboxylic Acid (ppm) | Polysaccharide (ppm) | pH | RR (Å/min) | DCN (counts) | DCO (counts) | DNN Haze (ppm) |
|---|---|---|---|---|---|---|---|
| C1 | none | none | 7.6 | 13 | 70000 | 70000 | 2.779 |
| C2 | none | HEC (607) | 9.8 | 664 | 1888 | 368 | 0.175 |
| 1A | TA (120) | HEC (607) | 8.1 | 124 | 11868 | 3868 | 0.017 |
| 1B | TA (8000) | XG (607) | 9.5 | 250 | 1193 | 1145 | 0.198 |

TABLE 1-continued

| Comp. | Carboxylic Acid (ppm) | Polysaccharide (ppm) | pH | RR (Å/min) | DCN (counts) | DCO (counts) | DNN Haze (ppm) |
|---|---|---|---|---|---|---|---|
| 1C | MA (5547) | XG (607) | 9.4 | 499 | 33924 | 786 | 0.503 |
| 1D[1] | TA (8000) | HEC (607) | 9.5 | 1534 | 7779 | 2647 | 0.077 |
| 1E | TA (8000) | HEC (607) | 9.4 | 1678 | 3444 | 524 | 0.167 |
| 1F | MA (5547) | HEC (607) | 9.5 | 1631 | 2918 | 324 | 0.094 |

[1]additionally contained 37 ppm SURFYNOL ™ 104

As is apparent from the results set forth in Table 1, polishing compositions of the invention can provide a good balance of substrate removal rate, defectivity, and haze.

Example 2

This example demonstrates the effect of the organic carboxylic acid and polysaccharide concentrations on substrate removal rate, defectivity, and haze of polishing compositions of the invention.

Similar silicon substrates were polished using a SURFIN™ 000 pad commercially available from Fujimi Corporation under the same conditions with 6 different polishing compositions identified as Polishing Compositions 2A-2F. Each of the polishing compositions contained (a) 4 wt. % Fuso PL2 silica particles, (b) the organic carboxylic acid MA in the concentration set forth in Table 2, (c) the polysaccharide HEC (MW=80,000 g/mol) in the concentration set forth in Table 2, (d) sufficient potassium hydroxide to provide each polishing composition with a pH as set forth in Table 2, and (e) water.

The substrate removal rate (RR), defectivity (both DCN and DCO), and haze (DNN) were determined for each polishing composition, and the results are summarized in Table 2. For ease of comparison, the information concerning Polishing Compositions C1 and C2 from Example 1 is included in Table 2.

TABLE 2

| Comp. | MA (ppm) | HEC (ppm) | pH | RR (Å/min) | DCN (counts) | DCO (counts) | DNN Haze (ppm) |
|---|---|---|---|---|---|---|---|
| C1 | none | none | 7.6 | 13 | 70000 | 70000 | 2.779 |
| C2 | none | 607 | 9.8 | 664 | 1888 | 368 | 0.175 |
| 2A | 3540 | 1007 | 8.5 | 0 | 70000 | 70000 | 1.982 |
| 2B | 3540 | 207 | 8.2 | 422 | 12156 | 549 | 0.163 |
| 2C | 3540 | 207 | 9.9 | 1011 | 3289 | 249 | 0.378 |
| 2D | 5547 | 607 | 9.6 | 1574 | 286 | 266 | 0.054 |
| 2E | 7540 | 207 | 8.4 | 1045 | 40771 | 3477 | 0.251 |
| 2F | 7540 | 207 | 9.9 | 1479 | 2427 | 296 | 0.289 |

As is apparent from the results set forth in Table 2, polishing compositions of the invention can provide a good balance of substrate removal rate, defectivity, and haze. In particular, higher amounts of both an organic carboxylic acid, e.g., malonic acid, and a polysaccharide, e.g., hydroxyethylcellulose, as evidenced by Polishing Composition 2D, exhibited an improved substrate removal rate, improved substrate defectivity, and improved substrate haze.

Example 3

This example demonstrates that polishing compositions of the invention, which comprise silica, an organic carboxylic acid, a polysaccharide, a base, optionally a surfactant, and water, exhibit good polishing properties.

Similar silicon substrates were polished using a SURFIN™ 000 pad, commercially available from Fujimi Corporation, under the same conditions with two polishing compositions identified as Polishing Compositions 3A and 3B, which contained (a) either 4% colloidal silica that has been surface modified with organic agents (Fuso PL2; 52 nm diameter) or a fumed silica (Cabot L90; 90 m$^2$/g surface area), (b) 5547 ppm malonic acid, (c) 607 ppm HEC (MW=80,000 g/mol), (d) potassium hydroxide, and (e) water.

The substrate removal rate (RR), defectivity (both DCN and DCO), and haze (DNN) were determined for each polishing composition, and the results are summarized in Table 3.

TABLE 3

| Comp. | Silica | RR (Å/min) | DCN (counts) | DCO (counts) | DNN Haze (ppm) |
|---|---|---|---|---|---|
| 3A | colloidal | 1452 | 1249 | 869 | 0.084 |
| 3B | fumed silica | 1269 | 565 | 706 | 0.064 |

As is apparent from the results set forth in Table 3, both colloidal (wet-process) silica and fumed silica, when included in polishing compositions of the invention exhibit good substrate removal rates with low substrate defectivity and good substrate haze.

Example 4

This example demonstrates that polishing compositions of the invention, which comprise silica, an organic carboxylic acid, a polysaccharide, a base, and water, can exhibit good overall polishing properties.

Similar silicon substrates were polished using a SPM3100 polishing pad (under the same conditions with 4 different polishing compositions identified as Polishing Compositions 4A-4D. Each of Polishing Compositions 4A-4D contained (a) 4 wt. % Fuso PL2 silica particles, (b) the organic carboxylic acid malonic acid, pipecolic acid, glycine, or lactic acid in the concentration set forth in Table 4, (c) 607 ppm of polysaccharide HEC (MW=80,000 g/mol), (d) sufficient potassium hydroxide to provide each polishing composition with a pH as set forth in Table 4, and (e) water.

The substrate removal rate (RR), defectivity (both DCN and DCO), and haze (DNN) were determined for each polishing composition, and the results are summarized in Table 4. For ease of comparison, the information concerning Polishing Composition C2 from Example 1 is included in Table 4.

TABLE 4

| Comp. | Carboxylic Acid (ppm) | pH | RR (Å/min) | DCN (counts) | DCO (counts) | DNN Haze (ppm) |
|---|---|---|---|---|---|---|
| | None | | | | | |
| C2 | none | 9.8 | 664 | 1888 | 368 | 0.175 |
| | Dicarboxylic Acid | | | | | |
| 4A[1] | MA (5547) | 9.3 | 1490 | 3189 | 2640 | 0.115 |
| | Amino Acid | | | | | |
| 4B | PA (6880) | 9.8 | 814 | 16415 | 655 | 0.107 |
| 4C[2] | Gly (4000) | 9.6 | 791 | 11795 | 542 | 0.101 |
| | Hydroxy Acid | | | | | |
| 4D | LA (4800) | 9.1 | 1080 | 19277 | 1791 | 0.095 |

[1]average of 3 runs
[2]average of 2 runs

As is apparent from the results set forth in Table 4, polishing compositions of the invention can provide a good balance of substrate removal rate, defectivity, and haze. In particular, the presence of an organic carboxylic acid, as evidenced by Polishing Compositions 4A-4D, exhibited an improved substrate removal rate and improved substrate haze, while maintaining reasonably good substrate defectivity.

Example 5

This example demonstrates polishing compositions of the invention, which comprise silica, an organic carboxylic acid, a polysaccharide, a base, optionally a surfactant, and water, can exhibit good overall polishing properties.

Similar silicon substrates were polished using a POLITEX™ Reg II polishing pad under the same conditions under the same condition with 11 different polishing compositions identified as Polishing Compositions 5A-5K. Each of Polishing Compositions 5A-5K contained (a) 4 wt. % Fuso PL2 silica particles, (b) the organic carboxylic acid TA or AEP in the concentration set forth in Table 5, (c) 607 ppm polysaccharide HEC (MW=100,000 g/mol), MeHEC, XG, C, or XG in the concentration set forth in Table 5, (d) sufficient potassium hydroxide to provide each polishing composition with a pH as set forth in Table 5, and (e) water.

Polishing Compositions 5A-5C, 5F-5H, 5J, and 5K did not contain a surfactant. Polishing Compositions 5D, 5E, and 5I further contained 37 ppm SURFYNOL™ 104, 80 ppm IGEPAL™ CO-730, and 37 ppm SURFYNOL™ 104, respectively.

Similar silicon substrates were polished using a POLITEX™ Reg II polishing pad under the same conditions with 2 other, comparative polishing compositions identified Polishing Compositions C3 and C4. Both Polishing Compositions C3 and C4 contained (a) 4 wt. % Fuso PL2 silica particles, (b) no organic carboxylic acid, (c) 607 ppm HEC (MW=100,000 g/mol), (d) sufficient potassium hydroxide to provide each polishing composition with a pH as set forth in Table 5, and (e) water.

The substrate removal rate (RR), defectivity (both DCN and DCO), and haze (DNN) were determined for each polishing composition, and the results are summarized in Table 5.

TABLE 5

| Comp. | Carboxylic Acid (ppm) | Polysaccharide (ppm) | pH | RR (Å/min) | DCN (counts) | DCO (counts) | DNN Haze (ppm) |
|---|---|---|---|---|---|---|---|
| C6[1] | none | HEC (607) | 9.2 | 672 | 29516 | 477 | 0.59 |
| C7[1] | none | HEC (607) | 9.4 | 767 | 34201 | 1146 | 0.68 |
| 5A[1] | TA (8000) | HEC (607) | 9.1 | 1396 | 12139 | 403 | 0.41 |
| 5B[1] | TA (8000) | HEC (607) | 9.4 | 1356 | 9277 | 330 | 0.18 |
| 5C | TA (8000) | MeHEC (607) | 9.3 | 1033 | 30199 | 298 | 0.26 |
| 5D[2] | TA (8000) | MeHEC (607) | 9.6 | 874 | 7036 | 381 | 0.11 |
| 5E[3] | TA (8000) | MeHEC (607) | 9.5 | 63 | 5243 | 3021 | 0.36 |
| 5F | TA (3340) | XG (140) | 10.4 | 403 | 294 | 269 | 0.28 |
| 5G | TA 10000) | XG (140) | 10.0 | 618 | 320 | 228 | 0.29 |
| 5H | TA (8000) | XG (607) | 9.4 | 506 | 471 | 367 | 0.17 |
| 5I[2] | TA (8000) | XG (67) | 9.2 | 386 | 1593 | 136 | 0.16 |
| 5J | TA (8000) | C (607) | 9.3 | 742 | 1710 | 274 | 0.18 |
| 5K | AEP (8000) | XG (607) | 9.9 | 4065 | 45966 | 52770 | 6.37 |

[1]molecular weight of HEC is 100,000 g/mol
[2]additionally contained 37 ppm SURFYNOL ™ 104
[3]additionally contained 80 ppm IGEPAL ™ CO-730

As is apparent from the results set forth in Table 5, polishing compositions of the invention can provide a good balance of substrate removal rate, defectivity, and haze.

Example 6

This example demonstrates polishing compositions of the invention comprising silica, an organic carboxylic acid, a polysaccharide, a base, optionally a polymer, and water.

Similar silicon substrates were polished using a SPM3100 polishing pad under the same conditions with 5 different polishing compositions identified as Polishing Composition 6A-6E. Each of Polishing Compositions 6A-6E contained (a) 4 wt. % Fuso PL2 silica particles, (b) 0.55 wt. % malonic acid, (c) 607 ppm HEC (MW=83,000 g/mol), (d) potassium hydroxide to adjust the pH to 9.6, (e) water, and (f) optionally a polymer, specifically a hydrophobated polyethylene glycol polyurethane as indicated in Table 6.

The substrate removal rate (RR) and haze (DNN) were determined for each polishing composition, and the results are summarized in Table 6.

TABLE 6

| Comp. | Polymer (ppm) | RR (Å/min) | DNN Haze (ppm) |
|---|---|---|---|
| 6A[1] | none | 1497 | 0.068 |
| 6B | DSX 3000 (60) | 690 | 0.025 |
| 6C | DSX 3000 (150) | 281 | 0.019 |
| 6D | DSX 3000 (300) | 300 | 0.016 |
| 6E[2] | BG PW25 (150) | 733 | 0.030 |

[1]average of 3 runs
[2]average of 4 runs

As is apparent from the results set forth in Table 6, polishing compositions containing either COGNIS DSX™ 3000 polymer or BORCHI™ Gel PW25 polymer exhibited an improved substrate haze as compared to the same polishing composition without any such polymer.

Example 7

This example demonstrates polishing compositions of the invention comprising silica, an organic carboxylic acid, a polysaccharide, a base, and water. This example further demonstrates the effect of the molecular weight of the polysaccharide on the substrate removal rate exhibited by the polishing composition.

Similar silicon substrates were polished using a SPM3100 polishing pad under the same conditions with 3 different polishing compositions identified as Polishing Compositions 7A-7C. Each of Polishing Compositions 7A-7C contained (a) 4 wt. % Fuso PL2 silica particles, (b) 0.55 wt. % malonic acid, (c) 607 ppm HEC having a molecular weight between 83,000-1,300,000 as indicated in Table 7, (d) potassium hydroxide, and (e) water.

The substrate removal rate (RR), defectivity (DCO), and haze (DNN) were determined for each polishing composition, and the results are summarized in Table 7.

TABLE 7

| Comp. | Average MW of HEC | RR (Å/min) | DCO (counts) | DNN haze (ppm) |
|---|---|---|---|---|
| 7A | 83,000 | 911 | 486 | 0.042 |
| 7B | 250,000 | 731 | 317 | 0.036 |
| 7C | 1,300,000 | 662 | 412 | 0.038 |

As is apparent from the results set forth in Table 7, the polishing composition containing HEC having an average molecular weight of 83,000 g/mol exhibited a higher removal rate than similar polishing compositions containing HEC having higher molecular weights.

Example 8

This example demonstrates polishing compositions of the invention comprising silica, an organic carboxylic acid, a polysaccharide, a base, and water.

Similar silicon substrates were polished using a SPM3100 polishing pad under the same conditions with 8 different polishing compositions identified as Polishing Compositions 8A-8H. Each of Polishing Compositions 8A-8H contained (a) 4 wt. % Fuso PL2 silica particles, (b) an organic carboxylic acid in a concentration set forth in Table 8, (c) 607 ppm HEC (MW=83,000 g/mol), (d) potassium hydroxide, and (e) water.

The substrate removal rate (RR), defectivity (DCO), and haze (DNN) were determined for each polishing composition, and the results are summarized in Table 8.

TABLE 8

| Comp. | Carboxylic Acid (wt. %) | RR (Å/min) | DCO (counts) | DNN Haze (ppm) |
|---|---|---|---|---|
| | dicarboxylic acid | | | |
| 8A[1] | malonic acid (0.55) | 744 | 997 | 0.075 |
| 8B | methyl malonic acid (0.62) | 936 | 875 | 0.290 |
| 8C | dimethyl malonic acid (0.70) | 913 | 681 | 0.060 |
| 8D | butyl malonic acid (0.85) | 1040 | 1100 | 0.063 |
| 8E | 2-butyl malonic acid (0.85) | 869 | 939 | 0.058 |
| 8F | sodium mesooxalate monohydrate (0.96) | 939 | 779 | 0.057 |
| | hydroxy acid | | | |
| 8G | DMPA (0.71) amino-carboxy substituted trazine | 322 | 544 | 0.019 |
| 8H | ATCA (0.68) | 609 | 272 | 0.036 |

[1]average of 3 runs

As is apparent from the results set forth in Table 8, polishing compositions of the invention can provide a good balance of substrate removal rate, defectivity, and haze.

Example 9

This example demonstrates polishing compositions of the invention comprising silica, an organic carboxylic acid, a polysaccharide, a base, optionally a polymer, and water. This example further demonstrates the effect of a polymer (e.g., BG PW25) and base concentration on substrate removal rate, defectivity, and haze exhibited by the polishing composition.

Similar silicon substrates were polished using a SPM3100 polishing pad under the same conditions with 5 different polishing compositions identified as Polishing Compositions 9A-9E. Each of Polishing Compositions 9A-9E contained (a) either 4 wt. % or 5 wt. % Fuso PL2 silica particles, (b) either 0.55 wt. % malonic acid (MA) or 0.68 wt. % 3-amino-1,2,4-triazole-5-carboxylic acid (ATCA), (c) 607 ppm HEC (MW=80,000 g/mol), (d) potassium hydroxide in the amount indicated in Table 9, and (e) water. Polishing Compositions 9B-E additionally contained 150 ppm of BORCHI™ Gel PW 25 as a hydrophobated polyethylene glycol polyurethane.

The substrate removal rate (RR), defectivity (DCO), and haze (DNN) were determined for each polishing composition, and the results are summarized in Table 9.

TABLE 9

| Comp. | Silica (wt. %) | Carboxylic Acid | KOH (wt. %) | BG PW25 (ppm) | RR (Å/min) | DCO (counts) | DNN Haze (ppm) |
|---|---|---|---|---|---|---|---|
| 9A | 4 | MA | 0.75 | 0 | 939 | 1399 | 0.067 |
| 9B | 4 | ATCA | 0.46 | 150 | 753 | 3251 | 0.054 |
| 9C | 5 | ATCA | 0.46 | 150 | 930 | 2366 | 0.057 |
| 9D | 4 | ATCA | 0.54 | 150 | 904 | 1306 | 0.083 |
| 9E | 5 | ATCA | 0.54 | 150 | 950 | 4227 | 0.080 |

As is apparent by the results set forth in Table 9, polishing compositions of the invention can provide a good balance of substrate removal rate, defectivity, and haze.

Example 10

This example demonstrates that polishing compositions of the invention comprising silica, an organic carboxylic acid, a polysaccharide, a base, optionally a polymer, and water exhibit good polishing properties.

Similar silicon substrates were polished using a SPM3100 polishing pad under the same conditions with 10 polishing compositions identified as Polishing Compositions 10A-10J. Each of Polishing Compositions 10A-10J contained (a) 4 wt. % Fuso PL2 silica particles, (b) either malonic acid or dimethylolpropionic acid in the concentration set forth in Table 10, (c) 607 ppm HEC (MW=80,000 g/mol), (d) potassium hydroxide in a concentration set forth in Table 10, and (e) water. Polishing Compositions 10B-10J further contained 150 ppm BORCHI™ PW25 as a hydrophobated polyethylene glycol polyurethane polymer.

The substrate removal rate (RR), defectivity (DCO), and haze (DNN) were determined for each polishing composition, and the results are summarized in Table 10.

TABLE 10

| Comp. | % Solids | DMPA (wt. %) | KOH (wt. %) | RR (Å/min) | DCO (counts) | DNN Haze (ppm) |
|---|---|---|---|---|---|---|
| 10A[1] | 4 | 0 (MA)[2] | 0.75 | 1488 | 746 | 0.077 |
| 10B | 4 | 0.7 | 0.46 | 809 | 3209 | 0.083 |
| 10C | 4 | 0.7 | 0.66 | 135 | 1527 | 0.102 |
| 10D | 4 | 1.1 | 0.46 | 747 | 1017 | 0.076 |
| 10E | 4 | 1.1 | 0.66 | 88 | 1954 | 0.047 |
| 10F | 4.5 | 0.9 | 0.56 | 194 | 1373 | 0.092 |
| 10G | 5 | 0.7 | 0.66 | 102 | 1599 | 0.077 |
| 10H | 5 | 0.7 | 0.46 | 875 | 1293 | 0.064 |
| 10I | 5 | 1.1 | 0.66 | 163 | 2053 | 0.038 |
| 10J | 5 | 1.1 | 0.46 | 1005 | 1868 | 0.092 |

[1]did not contain BORCHI™ Gel PW25
[2]contained MA (0.55 wt. %) instead of DMPA As is apparent by the results set forth in Table 10, polishing compositions of the invention can provide a good balance of substrate removal rate, defectivity, and haze.

Example 11

This example demonstrates that polishing compositions of the invention comprising silica, an organic carboxylic acid, a polysaccharide, a base, optionally a polymer, and water exhibit good polishing properties.

Similar silicon substrates were polished using a SPM3100 polishing pad under the same conditions with 7 polishing compositions identified as Polishing Compositions 11A-11G. Each of Polishing Compositions 11A-11G contained (a) 4 wt. % Fuso PL2 silica particles, (b) either malonic acid (MA), aspartic acid (Asp), bicine, or 3-aminopyrazine-2-carboxylic acid in the concentration set forth in Table 11, (c) 607 ppm HEC (MW=80,000 g/mol), (d) 0.55 wt. % potassium hydroxide, and (e) water. Polishing Compositions 11B-11F additionally contained 150 ppm BORCHI™ Gel PW25. The pH was adjusted to 0.6 with KOH.

The substrate removal rate (RR), defectivity (DCO), and haze (DNN) were determined for each polishing composition, and the results are summarized in Table 11.

TABLE 11

| Comp. | Carboxylic Acid (wt. %) | KOH (wt. %) | RR (Å/min) | DCO (counts) | DNN Haze (ppm) |
|---|---|---|---|---|---|
| 11A[1],[2] | MA (0.55) | 0.55 | 1074 | 1106 | 0.045 |
| 11B | Asp (0.71) | 0.71 | 788 | 1085 | 0.036 |
| 11C | bicine (0.87) | 0.87 | 884 | 1264 | 0.038 |
| 11D | bicine (0.87) | 0.87 | 728 | 1366 | 0.036 |
| 11E | bicine (1.27) | 1.27 | 940 | 1303 | 0.038 |
| 11F | bicine (1.27) | 1.27 | 1117 | 1242 | 0.043 |
| 11G | 3-aminopyrazine-2-carboxylic acid (0.74) | 0.68 | 878 | 1375 | 0.036 |

[1]average of 4 runs
[2]did not contain BORCHI™ Gel PW25

As is apparent by the results set forth in Table 11, polishing compositions of the invention can provide a good balance of substrate removal rate, defectivity, and haze.

Example 12

This example demonstrates that polishing compositions of the invention comprising silica, an organic carboxylic acid, a polysaccharide, a base, optionally a surfactant or polymer, and water exhibit good polishing properties.

Similar silicon substrates were polished using a SPM3100 polishing pad under the same conditions with 9 polishing compositions identified as Polishing Compositions 12A-12H. Each of Polishing Compositions 12A-12H contained (a) 4 wt. % Fuso PL2 silica particles, (b) 0.55 wt. % malonic acid, (c) 607 ppm HEC (MW=80,000 g/mol), (d) 0.75 wt. % KOH, (e) water, and (f) optionally a polymer or surfactant as set forth in Table 12.

The substrate removal rate (RR), defectivity (DCO), and haze (DNN) were determined for each polishing composition, and the results are summarized in Table 12.

TABLE 12

| Comp. | Polymer (150 ppm) | RR (Å/min) | DCO (counts) | DNN Haze (ppm) |
|---|---|---|---|---|
| 12A[1] | none | 1035 | 1157 | 0.087 |
| 12B | DSX 3000 | 472 | 2028 | 0.025 |
| 12C | BG PW25 | 488 | 1491 | 0.024 |
| 12D | BG 0024 | 658 | 1188 | 0.032 |
| 12E | BG L75 | 409 | 1758 | 0.025 |
| 12F | BG WN50S | 250 | 1378 | 0.020 |
| 12G | BG A LA | 622 | 794 | 0.045 |
| 12H | BG Thixo 2 | 788 | 1140 | 0.051 |

[1]average of 2 runs

As is apparent by the results set forth in Table 12, polishing compositions of the invention can provide a good balance of substrate removal rate, defectivity, and haze.

Example 13

This example demonstrates that polishing compositions of the invention comprising silica, an organic carboxylic acid, a polysaccharide, a base, a polymer, and water exhibit good polishing properties. This example also demonstrates the effect of polysaccharide, base, and polymer concentrations on substrate removal rate, defectivity, and haze.

Similar silicon substrates were polished using a SPM3100 polishing pad under the same conditions with 10 polishing compositions identified as Polishing Compositions 13A-13J. Each of Polishing Compositions 13A-13J contained (a) 4 wt. % Fuso PL2 silica particles, (b) 0.55 wt. % malonic acid, (c)

HEC in the concentration set forth in Table 13, (d) potassium hydroxide in the concentration set forth in Table 13, (e) BORCHI™ Gel PW25 in the concentration set forth in Table 13, and (f) water.

The substrate removal rate (RR), defectivity (DCO), and haze (DNN) were determined for each polishing composition, and the results are summarized in Table 13.

TABLE 13

| Comp. | HEC (ppm) | KOH (wt. %) | BG PW25 (ppm) | RR (Å/min) | DCO (counts) | DNN Haze (ppm) |
|---|---|---|---|---|---|---|
| 13A | 207 | 0.033 | 0 | 911 | 4533 | 0.073 |
| 13B | 207 | 0.043 | 0 | 1513 | 5061 | 0.103 |
| 13C | 207 | 0.033 | 300 | 356 | 1273 | 0.020 |
| 13D | 207 | 0.043 | 300 | 887 | 1332 | 0.040 |
| 13E[1] | 607 | 0.038 | 150 | 868 | 1104 | 0.030 |
| 13F | 1007 | 0.033 | 0 | 330 | 2068 | 0.024 |
| 13G | 1007 | 0.033 | 300 | 280 | 1550 | 0.017 |
| 13H | 1007 | 0.038 | 300 | 671 | 1226 | 0.024 |
| 13I | 1007 | 0.043 | 300 | 444 | 1015 | 0.026 |
| 13J | 1007 | 0.043 | 0 | 251 | 1145 | 0.024 |

[1]average of 2 runs

As is apparent by the results set forth in Table 13, polishing compositions of the invention can provide a good balance of substrate removal rate, defectivity, and haze.

Example 14

This example demonstrates that polishing compositions of the invention comprising silica, an organic carboxylic acid, a polysaccharide, a base, a surfactant or polymer, and water exhibit good polishing properties. This example also demonstrates the effect of surfactant concentration on substrate removal rate, defectivity, and haze.

Similar silicon substrates were polished using a SPM3100 polishing pad under the same conditions with 8 polishing compositions identified as Polishing Compositions 14A-14H. Each of Polishing Compositions 14A-14H contained (a) 4 wt. % Fuso PL2 silica particles, (b) 0.55 wt. % malonic acid, (c) 607 ppm HEC (MW=80,000 g/mol), (d) 0.75 wt. % KOH, (e) BORCHI™ Gel PW25 in the concentration set forth in Table 14, and (0 water.

The substrate removal rate (RR), defectivity (DCO), and haze (DNN) were determined for each polishing composition, and the results are summarized in Table 14.

TABLE 14

| Comp. | BG PW25 (ppm) | RR (Å/min) | DCO (counts) | DNN Haze (ppm) |
|---|---|---|---|---|
| 14A[1] | 0 | 1349 | 913 | 0.067 |
| 14B[2] | 60 | 1103 | 1006 | 0.057 |
| 14C[2] | 90 | 1065 | 860 | 0.052 |
| 14D[2] | 120 | 1014 | 949 | 0.048 |
| 14E[3] | 150 | 1020 | 1163 | 0.047 |
| 14F | 180 | 858 | 909 | 0.039 |
| 14G | 210 | 748 | 943 | 0.036 |
| 14H | 240 | 728 | 961 | 0.037 |

[1]average of 3 run
[2]average of 2 runs
[3]average of 7 runs

As is apparent by the results set forth in Table 14, Polishing Composition 14A, which did not contain any BORCHI™ Gel PW25 polymer, exhibited a high substrate removal rate, suitable substrate defectivity, and low substrate haze. Polishing Compositions 14B-14H, which contained BORCHI™ Gel PW25 polymer exhibited improved substrate haze, with suitable substrate removal rates and defectivities, as compared to Polishing Composition 14A under these polishing conditions.

Example 15

This example demonstrates that polishing compositions of the invention comprising silica, an organic carboxylic acid, a polysaccharide, a base, a polymer, and water exhibit good polishing properties. This also example demonstrates the effect of surfactant and polymer concentration on substrate removal rate, defectivity, and haze.

Similar silicon substrates were polished using a SPM3100 polishing pad under the same conditions with 7 polishing compositions identified as Polishing Compositions 15A-15G. Each of Polishing Compositions 15A-15G contained (a) 4 wt. % Fuso PL2 silica particles, (b) 0.55 wt. % malonic acid, (c) 607 ppm HEC (MW=80,000 g/mol), (d) 0.75 wt. % KOH, (e) water, and (f) optionally a polymer in the concentration set forth in Table 15.

The substrate removal rate (RR), defectivity (DCO), and haze (DNN) were determined for each polishing composition, and the results are summarized in Table 15.

TABLE 15

| Comp. | Polymer (ppm) | RR (Å/min) | DCO (counts) | DNN Haze (ppm) |
|---|---|---|---|---|
| 15A | none | 1132 | 9749 | 0.088 |
| 15B | BG WN50S (50) | 947 | 4029 | 0.068 |
| 15C | BG WN50S (100) | 703 | 1856 | 0.055 |
| 15D | BG WN50S (150) | 314 | 1129 | 0.018 |
| 15E | BG A LA (150) | 1234 | 9127 | 0.100 |
| 15F | BG A LA (250) | 1190 | 1153 | 0.096 |
| 15G | BG A LA (400) | 1185 | 758 | 0.084 |

As is apparent by the results set forth in Table 15, Polishing Composition 15A, which did not contain any polymer, exhibited a suitable substrate removal rate and good substrate haze. In contrast, Polishing Compositions 15B-15D comprising BORCHI™ Gel WN50S exhibited improved substrate defectivity and haze as compared to Polishing Composition 15A under these polishing conditions. Moreover, Polishing Compositions 15E-15G comprising BORCHI™ Gel A LA exhibited improved substrate removal rates and defectivity, with suitable substrate haze, as compared to Polishing Composition 15A under these polishing conditions.

Example 16

This example demonstrates that polishing compositions of the invention comprising silica, an organic carboxylic acid, a polysaccharide, a base, a polymer, and water exhibit good polishing properties.

Similar silicon substrates were polished using a SPM3100 polishing pad under the same conditions with 5 polishing compositions identified as Polishing Compositions 16A-16E. Each of Polishing Compositions 16A-16E contained (a) 4 wt. % Fuso PL2 silica particles, (b) 0.55 wt. % malonic acid, (c) 607 ppm HEC (MW=80,000 g/mol), (d) 0.75 wt. % KOH, (e) water, and (f) optionally a polymer in the concentration set forth in Table 16.

The substrate removal rate (RR), defectivity (DCO), and haze (DNN) were determined for each polishing composition, and the results are summarized in Table 16.

TABLE 16

| Comp. | Polymer (ppm) | RR (Å/min) | DCO (counts) | DNN Haze (ppm) |
|---|---|---|---|---|
| 16A | none | 1385 | 1024 | 0.062 |
| 16B[1] | BG PW25 (150) | 971 | 1133 | 0.039 |
| 16C | ALCOGUM ™ 283-30 (150) | 1577 | 1487 | 0.062 |
| 16D | ALCOGUM ™ L15 (150) | 1552 | 1710 | 0.061 |
| 16E | ALCOGUM ™ L31 (150) | 1567 | 1067 | 0.062 |

[1] average of 3 runs

As is apparent by the results set forth in Table 16, Polishing Composition 16A, which did not contain a polymer, exhibited a suitable substrate removal rate, defectivity, and haze. In contrast, Polishing Composition 16B comprising a polyethylene glycol polyurethane exhibited an improved substrate haze, with a suitable substrate removal rate and defectivity, as compared to Polishing Composition 16A under these polishing conditions. Moreover, Polishing Compositions 16C-16E comprising water soluble acrylate polymers exhibited improved substrate removal rates, with suitable substrate defectivities, and haze, as compared to Polishing Composition 16A under these polishing conditions.

Example 17

This example demonstrates that polishing compositions of the invention comprising silica, an organic carboxylic acid, a polysaccharide, a base, a surfactant or polymer, and water exhibit good polishing properties. This example also demonstrates the effect of polymer concentrations on substrate removal rate, defectivity, and haze.

Similar silicon substrates were polished using a SPM3100 polishing pad under the same conditions with 10 polishing compositions identified as Polishing Compositions 17A-17J. Each of Polishing Compositions contained (a) 4 wt. % Fuso PL2 silica particles, (b) 0.55 wt. % malonic acid, (c) 607 ppm HEC (MW=80,000 g/mol), (d) 0.75 wt. % KOH, (e) water, and (f) optionally a polymer in the concentration set forth in Table 17.

The substrate removal rate (RR), defectivity (DCO), and haze (DNN) were determined for each polishing composition. The results are summarized in Table 17.

TABLE 17

| Comp. | Polymer (ppm) | RR (Å/min) | DCO (counts) | DNN Haze (ppm) |
|---|---|---|---|---|
| 17A | none | 1331 | 925 | 0.050 |
| 17B | BG PW25 (150) | 778 | 1081 | 0.033 |
| 17C | BG WN50S (75) | 897 | 958 | 0.033 |
| 17D | BG WN50S (100) | 403 | 1318 | 0.022 |
| 17E | BG WN50S (125) | 148 | 1978 | 0.022 |
| 17F | BG A LA (400) | 1340 | 856 | 0.041 |
| 17G | BG A LA (800) | 1340 | 1006 | 0.040 |
| 17H | BG A LA (1600) | 1338 | 923 | 0.040 |
| 17I | BG 0434 (210) | 616 | 1125 | 0.026 |
| 17J | BG 0434 (250) | 529 | 1202 | 0.025 |

As is apparent by the results set forth in Table 17, substrates polished with a polishing composition comprising either a surfactant or polymer (e.g., BG urethane or BG acrylate) had decreased substrate haze under these polishing conditions as compared to substrates polished with a polishing composition that did not contain such an additional additive.

Example 18

This example demonstrates that polishing compositions of the invention comprising silica, an organic carboxylic acid, a polysaccharide, a base, optionally a reducing agent, and water exhibit good polishing properties.

Similar silicon substrates were polished under the same conditions using a CIEGAL™ 7355 pad with 7 different polishing compositions identified as Polishing Compositions 18A-18G. Each of Polishing compositions 18A-18F contained (a) 4 wt. % Fuso PL2 silica particles, (b) either MA or gallic acid in the concentration set forth in Table 18, (c) 607 ppm of the polysaccharide HEC (MW=80,000 g/mol), (d) potassium hydroxide in the concentration set forth in Table 18, and (e) water. In addition, Polishing Compositions 18B-18G also contained either potassium bicarbonate or potassium metabisulfite in the concentration set forth in Table 18.

The substrate removal rate (RR), defectivity (DCO), and haze (DNN) haze were determined for each polishing composition, and the results are summarized in Table 18.

TABLE 18

| Comp. | Acid (wt. %) | KOH (wt. %) | KHCO$_3$ (wt. %) | KHSO$_3$ (wt. %) | RR (Å/min) | DCO (counts) | DNN haze (ppm) |
|---|---|---|---|---|---|---|---|
| 18A | MA (0.55) | 0.76 | 0 | 0 | 39 | 2181 | 0.036 |
| 18B | MA (0.17) | 0.32 | 0.17 | 0 | 30 | 1712 | 0.015 |
| 18C | MA (0.55) | 0.76 | 0 | 0.13 | 371 | 1011 | 0.035 |
| 18D | MA (0.55) | 0.76 | 0 | 0.04 | 218 | 1006 | 0.015 |
| 18E | GA (0.64) | 0.58 | 0.17 | 0 | 600 | 1089 | 0.035 |
| 18F | GA (0.94) | 0.74 | 0.21 | 0 | 520 | 716 | 0.019 |
| 18G | GA (0.64) | 0.72 | 0.17 | 0 | 476 | 1258 | 0.032 |

As is apparent from the results set forth in Table 18, polishing compositions of the invention can provide a good balance of substrate removal rate, defectivity, and haze.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein.

Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition consisting essentially of:
   (a) silica,
   (b) one or more organic carboxylic acids, salts, or hydrates thereof selected from the group consisting of (i) dicarboxylic acids of the formula:

   $$HO_2C-(CR^1R^2)_n-CO_2H,$$

wherein n is an integer of 0-8 and each of $R^1$ and $R^2$ is independently selected from the group consisting of hydrogen, a hydroxyl group, and $C_1$-$C_6$ alkyl groups, or $R^1$ and $R^2$ together form an oxo group, and when n is 2 or more, the bonds between the $CR^1R^2$ groups are independently selected from the group consisting of single, double, or triple bonds; (ii) amino acids of the formula:

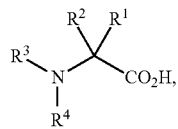

wherein each of $R^1$, $R^2$, $R^3$, and $R^4$ is independently selected from the group consisting of hydrogen, an aminoalkyl group, a carboxyalkyl group, a hydroxyalkyl group, a —$(CH_2)_n$— group, and —$(CH=CH—)_n$ group connecting either $R^1$ or $R^2$ with either $R^3$ or $R^4$, wherein n is an integer of 1-6; (iii) hydroxy acids of formula (1):

   $$(R^3R^2R^1C)_n-CO_2H, \quad (1)$$

wherein n is an integer of 0-8, and each of $R^1$-$R^3$ is independently selected from the group consisting of hydrogen, alkyl, hydroxy, and hydroxyalkyl, wherein at least one of $R^1$-$R^3$ is hydroxy or hydroxyalkyl, or formula (2):

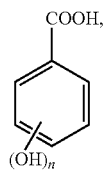

wherein n is an integer of 1-5; (iv) carboxy substituted pyrazine compounds; and (v) carboxy substituted triazole compounds,
   (c) one or more polysaccharides selected from the group consisting of a hydroxyalkylcellulose, carrageenan, and xanthan gum,
   (d) one or more bases,
   (e) optionally one or more surfactants and/or polymers,
   (f) optionally one or more reducing agents,
   (g) optionally one or more biocides, and
   (h) water,
   wherein the polishing composition has an alkaline pH.

2. The polishing composition of claim 1, wherein the silica is present in an amount of about 0.001 wt. % to about 20 wt. % of the polishing composition.

3. The polishing composition of claim 2, wherein the silica is present in an amount of about 0.05 wt. % to about 10 wt. % of the polishing composition.

4. The polishing composition of claim 1, wherein the silica is wet-process silica.

5. The polishing composition of claim 1, wherein the one or more organic carboxylic acids are present in a total amount of about 0.0005 wt. % to about 2 wt. % of the polishing composition.

6. The polishing composition of claim 1, wherein the dicarboxylic acid is selected from the group consisting of malonic acid, methyl malonic acid, dimethyl malonic acid, butyl malonic acid, maleic acid, sodium mesooxalate monohydrate, tartaric acid, malic acid, oxalic acid, and mixtures thereof.

7. The polishing composition of claim 6, wherein the dicarboxylic acid is malonic acid.

8. The polishing composition of claim 1, wherein the amino acid is selected from the group consisting of glycine, serine, glutamic acid, aspartic acid, lysine, bicine, nitrilotriacetic acid, pipecolic acid, picolinic acid, and proline.

9. The polishing composition of claim 1, wherein at least one organic carboxylic acid is a carboxy substituted pyrazine compound.

10. The polishing composition of claim 9, wherein the carboxy substituted pyrazine compound is 3-aminopyrazine-2-carboxylic acid.

11. The polishing composition of claim 1, wherein the carboxy substituted triazole compound is 3-amino-1,2,4-triazole-5-carboxylic acid.

12. The polishing composition of claim 1, wherein the hydroxy acid is selected from the group consisting of aliphatic hydroxy acids and aromatic hydroxy acids.

13. The polishing composition of claim 12, wherein the aliphatic hydroxy acid is selected from the group consisting of lactic acid, glycolic acid, 2-hydroxybutyric acid, and dimethylolpropionic acid.

14. The polishing composition of claim 1, wherein the aromatic hydroxy acid is selected from the group consisting of gallic acid, 4-hydroxybenzoic acid, salicylic acid, 2,4-dihydroxybenzoic acid, 2,3-dihydroxybenzoic acid, and 3,4-dihydroxybenzoic acid.

15. The polishing composition of claim 1, wherein at least one polysaccharide is a hydroxyalkyl cellulose.

16. The polishing composition of claim 15, wherein the hydroxyalkyl cellulose is hydroxyethyl cellulose.

17. The polishing composition of claim 16, wherein the average molecular weight of the hydroxyethyl cellulose is about 300,000 g/mol or less.

18. The polishing composition of claim 17, wherein the average molecular weight of the hydroxyethyl cellulose is about 10,000 g/mol to about 100,000 g/mol.

19. The polishing composition of claim 1, wherein at least one base is selected from the group consisting of an alkali metal hydroxide, an alkali metal carbonate, an alkali metal bicarbonate, and a borate.

20. The polishing composition of claim 19, wherein at least one base is selected from the group consisting of potassium hydroxide, potassium carbonate, and potassium bicarbonate.

21. The polishing composition of claim 1, wherein the pH is about 8-12.

22. The polishing composition of claim 21, wherein the pH is about 9-11.

23. The polishing composition of claim 1, wherein one or more surfactants and/or polymers are present in the polishing composition.

24. The polishing composition of claim 23, wherein at least one surfactant is a nonionic surfactant.

25. The polishing composition of claim 24, wherein the surfactant is an acetylenic diol surfactant or a hydrophobated polyethylene glycol.

26. The polishing composition of claim 23, wherein the one or more polymers is a polyethylene glycol polyurethane or a water soluble acrylic.

27. The polishing composition of claim 1, wherein the reducing agent is potassium metabisulfite.

28. The polishing composition of any one of claims 1-27, wherein one or more biocides are present in the polishing composition.

29. The polishing composition of claim 28, wherein the biocide is an isothiazolinone biocide.

30. A method of chemically-mechanically polishing a substrate comprising:
   (i) contacting a substrate with a polishing pad and a chemical-mechanical polishing composition consisting essentially of:
       (a) silica,
       (b) one or more organic carboxylic acids or salts thereof selected from the group consisting of (i) dicarboxylic acids of the formula:

wherein n is an integer of 0-8 and each of $R^1$ and $R^2$ is independently selected from the group consisting of hydrogen, a hydroxyl group, and $C_1$-$C_6$ alkyl groups, or $R^1$ and $R^2$ together form an oxo group; and when n is 2 or more, the bonds between the $CR^1R^2$ groups are independently selected from the group consisting of single, double, or triple bonds; (ii) amino acids of the formula:

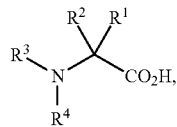

wherein each of $R^1$, $R^2$, $R^3$, and $R^4$ is independently selected from the group consisting of hydrogen, an aminoalkyl group, a carboxyalkyl group, a hydroxyalkyl group, a —$(CH_2)_n$— group, a —$(CH=CH—)_n$ group connecting either $R^1$ or $R^2$ with either $R^3$ or $R^4$, wherein n is an integer of 1-6; (iii) hydroxy acids of the formula (1):

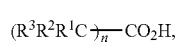 (1)

wherein n is an integer of 0-8, and each of $R^1$-$R^3$ is independently selected from the group consisting of hydrogen, alkyl, hydroxy, and hydroxyalkyl, wherein at least one of $R^1$-$R^3$ is hydroxy or hydroxyalkyl, or the formula (2):

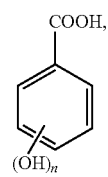 (2)

wherein n is an integer of 1-5; (iv) carboxy substituted pyrazine compounds; and (v) carboxy substituted triazole compounds,
   (c) one or more polysaccharides selected from the group consisting of a hydroxyalkylcellulose, carrageenan, and xanthan gum,
   (d) one or more bases,
   (e) optionally one or more surfactants and/or polymers,
   (f) optionally one or more reducing agents,
   (g) optionally one or more biocides, and
   (h) water,
wherein the polishing composition has an alkaline pH,
   (ii) moving the polishing pad relative to the substrate with the chemical-mechanical polishing composition therebetween, and
   (iii) abrading at least a portion of the substrate to polish the substrate.

31. The method of claim 30, wherein the silica is present in an amount of about 0.001 wt. % to about 20 wt. % of the polishing composition.

32. The method of claim 31, wherein the silica is present in an amount of about 0.05 wt. % to about 10 wt. % of the polishing composition.

33. The method of claim 30, wherein the silica is wet-process silica.

34. The method of claim 30, wherein the one or more organic carboxylic acids are present in a total amount of about 0.0005 wt. % to about 2 wt. % of the polishing composition.

35. The method of claim 30, wherein the dicarboxylic acid is selected from the group consisting of malonic acid, methyl malonic acid, dimethyl malonic acid, butyl malonic acid, maleic acid, sodium mesooxalate monohydrate, tartaric acid, malic acid, oxalic acid, and mixtures thereof.

36. The method of claim 35, wherein the dicarboxylic acid is malonic acid.

37. The method of claim 30, wherein the amino acid is selected from the group consisting glycine, serine, glutamic acid, aspartic acid, lysine, bicine, nitrilotriacetic acid, pipecolic acid, picolinic acid, and proline.

38. The method of claim 30, wherein at least one organic carboxylic acid is a carboxy substituted pyrazine compound.

39. The method of claim 38, wherein the amino-carboxy substituted pyrazine compound is 3-aminopyrazine-2-carboxylic acid.

40. The method of claim 30, wherein the carboxy substituted triazole compound is 3-amino-1,2,4-triazole-5-carboxylic acid.

41. The method of claim 30, wherein the hydroxy acid is selected from the group consisting of aliphatic hydroxy acids and aromatic hydroxy acids.

42. The method of claim 41, wherein the aliphatic hydroxy acid is selected from the group consisting of lactic acid, glycolic acid, 2-hydroxybutyric acid, and dimethylolpropionic acid.

43. The method of claim 41, wherein the aromatic hydroxy acid is selected from the group consisting of gallic acid, 4-hydroxybenzoic acid, salicylic acid, 2,4-dihydroxybenzoic acid, 2,3-dihydroxybenzoic acid, and 3,4-dihydroxybenzoic acid.

44. The method of claim 30, wherein at least one polysaccharide is a hydroxyalkyl cellulose.

45. The method of claim 44, wherein the hydroxyalkyl cellulose is hydroxyethyl cellulose.

46. The method of claim 45, wherein the average molecular weight of the hydroxyethyl cellulose is about 300,000 g/mol or less.

47. The method of claim 46, wherein the average molecular weight of the hydroxyethyl cellulose is about 10,000 g/mol to about 100,000 g/mol.

48. The method of any one of claim 30, wherein at least one base is selected from the group consisting of an alkali metal hydroxide, an alkali metal carbonate, an alkali metal bicarbonate, and a borate.

49. The method of claim 48, wherein at least one base is selected from the group consisting of potassium hydroxide, potassium carbonate, and potassium bicarbonate.

50. The method of claim 30, wherein the pH is about 8-12.

51. The method of claim 50, wherein the pH is about 9-11.

52. The method of claim 30, wherein one or more surfactants and/or polymers are present in the polishing composition.

53. The method of claim 30, wherein at least one surfactant is a nonionic surfactant.

54. The method of claim 53, wherein the surfactant is an acetylenic diol surfactant or a hydrophobated polyethylene glycol.

55. The method of claim 30, wherein the one or more polymers is a polyethylene glycol polyurethane or a water soluble acrylic.

56. The method of claim 30, wherein the reducing agent is potassium metabisulfite.

57. The method of claim 30, wherein the substrate comprises silicon, and a portion of the silicon is abraded to polish the substrate.

58. The method of claim 30, wherein one or more biocides are present in the polishing composition.

59. The polishing composition of claim 58, wherein the biocide is an isothiazolinone biocide.

* * * * *